United States Patent
Cork et al.

(10) Patent No.: US 8,129,992 B2
(45) Date of Patent: Mar. 6, 2012

(54) BORE TUBE ASSEMBLY

(75) Inventors: Peter Cork, Romsey (GB); David William Huish, Winchester (GB); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 289 days.

(21) Appl. No.: 12/613,004

(22) Filed: Nov. 5, 2009

(65) Prior Publication Data

US 2010/0117652 A1    May 13, 2010

(30) Foreign Application Priority Data

Nov. 12, 2008  (GB) .................................. 0820689.8
Mar. 5, 2009   (GB) .................................. 0903729.2

(51) Int. Cl.
*G01V 3/00* (2006.01)
(52) U.S. Cl. ........................................ 324/318; 324/322
(58) Field of Classification Search .......... 324/300–322; 600/407–445
See application file for complete search history.

(56) References Cited

U.S. PATENT DOCUMENTS

| | | | | |
|---|---|---|---|---|
| 5,715,819 A * | 2/1998 | Svenson et al. | ............... | 600/425 |
| 5,829,437 A * | 11/1998 | Bridges | ......................... | 600/430 |
| 6,549,799 B2 * | 4/2003 | Bock et al. | .................... | 600/422 |
| 7,417,433 B2 * | 8/2008 | Heid et al. | .................... | 324/318 |
| 7,518,367 B2 * | 4/2009 | Renz et al. | .................... | 324/318 |
| 2007/0013376 A1 | 1/2007 | Heid et al. | | |
| 2008/0157769 A1 | 7/2008 | Renz et al. | | |
| 2008/0319285 A1 * | 12/2008 | Hancock | ....................... | 600/309 |
| 2010/0253350 A1 * | 10/2010 | Huish et al. | .................. | 324/318 |

* cited by examiner

*Primary Examiner* — Brij Shrivastav
(74) *Attorney, Agent, or Firm* — Schiff Hardin LLP

(57) ABSTRACT

A wireless magnetic resonance imaging (MRI) scanner bore tube assembly has a radio frequency (RF) antenna, a microwave antenna array and an electrical screen. The RF antenna is formed of a series of RF antenna elements, each comprising a rung. The rungs are spaced at intervals of substantially half of the wavelength of the frequency of operation of the microwave antenna array. The microwave antenna array is formed by a series of microwave antenna elements interleaved between the rungs and the screen acts as a reflector to reflect signals from the microwave antenna elements towards the center of the bore tube.

17 Claims, 4 Drawing Sheets

BORE TUBE ASSEMBLY

RELATED APPLICATIONS

The present application is related to the following applications filed simultaneously herewith and respectively having Ser. No. 12/612,831, Ser. No. 12/612,842, Ser. No. 12/612,856, Ser. No. 12/613,033 and Ser. No. 12/613,082.

BACKGROUND OF THE INVENTION

1. Field of the Invention

This invention relates to a wireless magnetic resonance imaging (MRI) scanner bore tube assembly and in particular to an arrangement of microwave dipole antennas of a magnetic resonance imaging (MRI) birdcage antenna using an electrical screen as a reflector.

2. Description of the Prior Art

MRI scanners use a combination of a strong constant magnetic field (B0) from a superconducting magnet which is modified by gradient fields generated by gradient coils, together with a rotating magnetic field (B1) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the patient. Associated with each mat is a flexible cable typically containing one co-axial line for each local coil. The cables interact with the B1 field and with the signals generated from the patient so 'traps' (high impedance sections) must be included at regular (typically λ/8) intervals. These add cost and inconvenience to the structure.

In use, the requirement to connect the cables and sterilize them between scanning one patient and the next leads to increased down-time between scans. It is therefore desirable that the cables be eliminated.

SUMMARY OF THE INVENTION

In accordance with a first aspect of the present invention a wireless magnetic resonance imaging (MRI) scanner bore tube assembly, the bore tube assembly has a radio frequency (RF) antenna, a microwave antenna array and an electrical screen. The RF antenna is formed by a series of RF antenna elements, each having a rung, with the rungs being spaced at intervals of substantially half of the wavelength of the frequency of operation of the microwave antenna array. The microwave antenna array is formed by a series of microwave antenna elements interleaved between the rungs; and the screen acts as a reflector to reflect signals from the microwave antenna elements toward the center of the bore tube.

The present invention enables a wireless solution to this requirement. Ideally, the wireless solution substantially satisfies the requirements of the existing wired system, maintaining in particular the low noise figure and the dynamic range.

Preferably, the RF antenna is implemented as etched copper structures on a thin printed circuit board (PCB) mounted on a support tube.

Preferably, the microwave antenna array is implemented as etched copper structures on a thin PCB and mounted on the support tube.

The RF antenna, microwave antenna array and additional microwave antenna elements are implemented as different layers on the PCB.

Preferably, the microwave antenna elements comprise one of dipole antennas, folded dipole antennas, inductively loaded dipole antennas or capacitively loaded dipole antennas.

Preferably, the microwave antenna elements are fed by a microstrip or stripline transmission line structure.

Preferably, filters are provided at ends of transmission lines, of the transmission line structure, remote from the microwave antenna elements.

Preferably, the RF antenna array further comprises an end ring segment at each end of each rung, forming end rings.

Preferably, the end rings further comprise slot antennas.

Preferably, the slot antennas are aligned substantially parallel with a dominant current flow direction in the end rings.

Preferably, additional microwave antenna elements are provided beyond the end rings of the RF antenna array.

Preferably, the additional microwave antenna elements comprise one of dipole antennas or patch antennas.

Preferably, the additional microwave antenna elements are implemented as etched copper structures on a thin PCB and mounted on the support tube.

Preferably, the RF antenna is a birdcage antenna.

Preferably, the support tube is substantially electrically insulating.

Preferably, the electrical screen is radially outward of the insulating mount.

Preferably, the electrical screen comprises a copper screen.

In accordance with a second aspect of the present invention, a wireless MRI scanner has a magnet, gradient coils, a number of local coils; and a bore tube according to the first aspect.

DESCRIPTION OF THE PREFERRED EMBODIMENTS

The wireless concept to which the features of the present invention apply is based on upconversion of the RF (Larmor) frequency signals to microwave frequencies and transmission from local coils located in the patient mat to microwave antennas located on the bore of the scanner. The combination of transmit and receive antennas on the patient and bore respectively constitutes a MIMO (Multiple Input/Multiple Output) system. The greater multiplicity of receive antennas in the bore array allows individual signals from the patient antennas to be resolved. The present invention relates to the bore tube for use in the system described above and in particular to an arrangement of the microwave antenna arrays.

Figure 1:
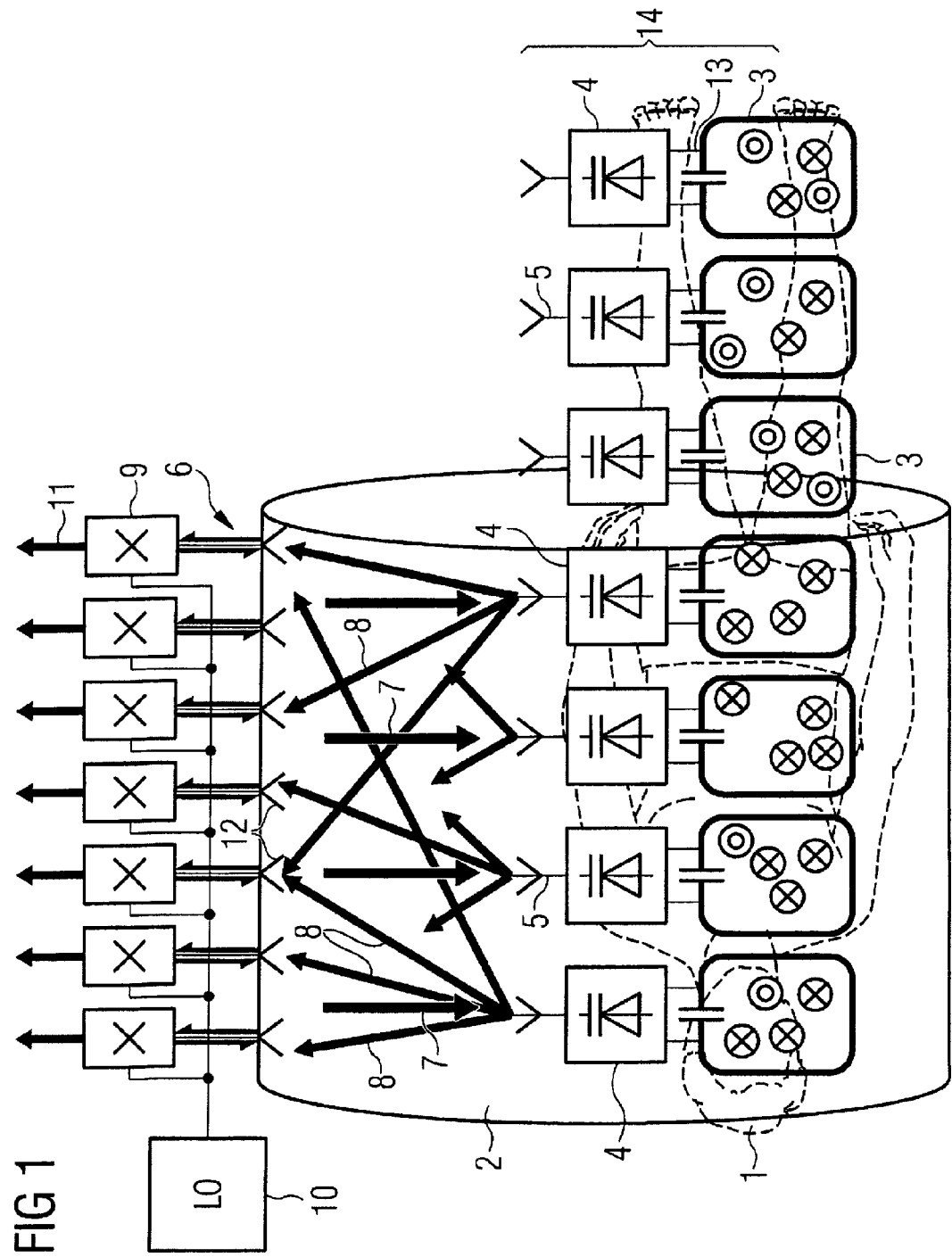
FIG. 1 illustrates a wireless MRI system incorporating a bore tube assembly in accordance with the present invention.

An example of an MRI system using a MIMO microwave link, suitable for using a bore tube according to the present invention will now be described. However, other architectures are possible and the invention is not limited to the one described below. FIG. 1 shows a patient 1 within an MRI scanner bore tube 2. A mat covers the part of the patient for imaging and embedded in the mat are a plurality of local coils 3. Associated with each local coil 3 is an upconverter 4 and microwave antenna 5. Transceivers 9 connected to an array 6 of antennas 12 are integrated into the scanner bore 2. The frequency upconverter 4 for each patient mat coil 3 produces signals for transmission to the array of transceivers in the scanner bore 2. A signal generator 10 generates a local oscillator (LO) signal at 2.44 GHz, or other chosen microwave frequency, which feeds the transceivers connected to the antenna array 6 to illuminate the patient coil electronics 14 with a signal 7 at the local oscillator frequency. The same LO signal in the transceivers converts the microwave signals 8, received from the patient coils 3 at the LO frequency ±63 MHz, back to the original magnetic resonance (MR) frequency of 63 MHz for input 11 to MR receivers in an image processing system (not shown). The local coil upconverters 4 are based on parametric amplifiers and implement low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6. In one embodiment of the present invention, an arrangement of microwave dipole antennas is fabricated on the same printed circuit board as a magnetic resonance imaging (MRI) birdcage antenna and located between the rungs. The radio frequency (RF) screen, located on the inner surface of the gradient coil acts as a reflector for the microwave antennas In order for the wireless system to operate with minimal or no degradation in received signal to noise ratio the array 6 of microwave antennas 12 around the bore 2 must have element centre to element centre spacing in both directions, around and along the bore, of the order of half the wavelength of the operational microwave frequency. Patient coil spacing influences the choice of microwave link frequency but in general, any microwave frequency may be chosen providing that it is high enough to provide the spatial resolution and low enough that the number of required bore antenna elements and associated electronics is practical. Operation at 2.44 GHz gives an antenna spacing of about 6 cm.

Figure 2:
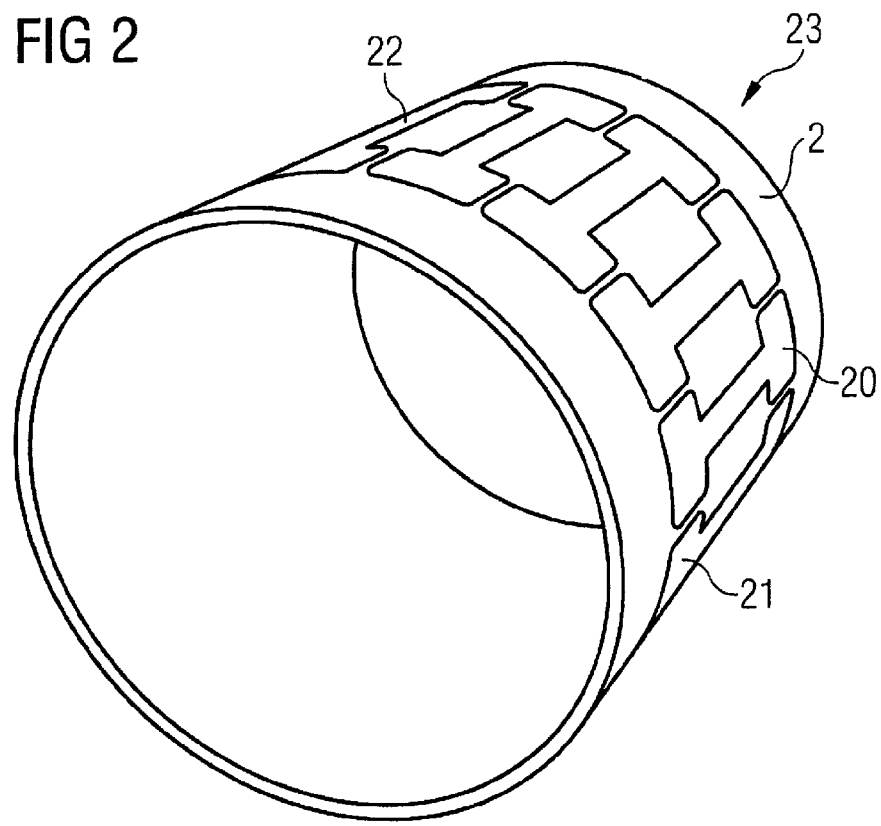
FIG. 2 illustrates a schematic outline of a simplified conventional birdcage type RF antenna.

As described earlier, MRI scanners necessarily incorporate an RF antenna that generates the B1 field at the Larmor frequency, which is dependent upon the B0 field strength, so is 63.6 MHz for a typical 1.5 Tesla B0 magnetic field, or 123 MHz for a 3 T system. These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz. Commonly the construction of the B1 field antenna 24, also known as the 'body coil', takes the form of a 'birdcage' with two separated rings 20, 21 printed around the bore 2 and connected by a number of rungs 22 regularly spaced around the bore, as shown in FIG. 2. Each element 23 of the antenna is formed of a rung and a part of each ring. The width and spacing of the rungs around the circumference of the bore are chosen to maintain half wavelength spacing of the microwave elements and provide sufficient current handling capability for the body coil. The minimum gap between end ring segments that form the end rings is determined by the RF voltage present between adjacent segments during the excitation phases of a scan. The length of the rungs and the dimensions of the end ring segments are dependent upon the volume that needs to be imaged and the constraints imposed by specific absorption rate (SAR) limits. Capacitors and diodes (not shown) are incorporated in the design of the body coil at appropriate positions for tuning and switching purposes. A screen 34 is printed on the inside of the gradient coil (not shown) to minimize undesired egress of B1 field energy outside the bore imaging region. A gap of 1 to 2 cm of air or glass reinforced plastic (GRP) between the screen and the body coil allows a flux return path for the magnetic fields generated by the body coil rung currents.

The present invention aims to provide an arrangement of microwave antennas that satisfies a number of requirements. These include high efficiency, i.e. that gain is directed towards the centre of the bore; a consistently good impedance match over a useful range of angles of incidence; a negligible effect on B1 field uniformity and strength; practical implementation of feeds to the microwave antennas and the creation of a microwave absorptive surface achieved by the half wavelength spacing of the elements in the array.

Figure 3:
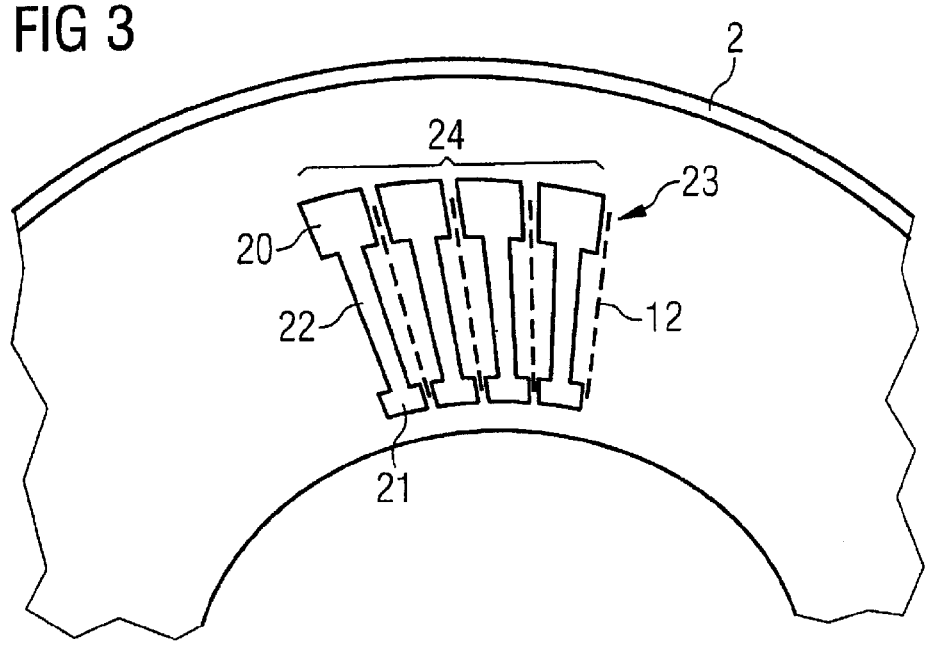
FIG. 3 illustrates the integration of microwave antenna elements into a birdcage RF antenna with a bore tube assembly in accordance with the present invention.

A first aspect of the present invention is that the number of body coil rungs around the bore is arranged, such that the separation between adjacent rungs is nominally equal to $\lambda/2$ at the LO frequency, which for the example given above means a separation of about 6 cm. Dipole antennas, which may take the form of 'standard' dipole antennas, folded dipole antennas, inductively loaded or capacitively loaded dipole antennas, are located in between and coplanar with the rungs and orientated as shown in FIG. 3. In a practical implementation, the birdcage rungs and antenna elements cover the entire circumference of the bore tube 2, but for clarity, only a subset of antenna elements are shown in the Figures.

Figure 5A:
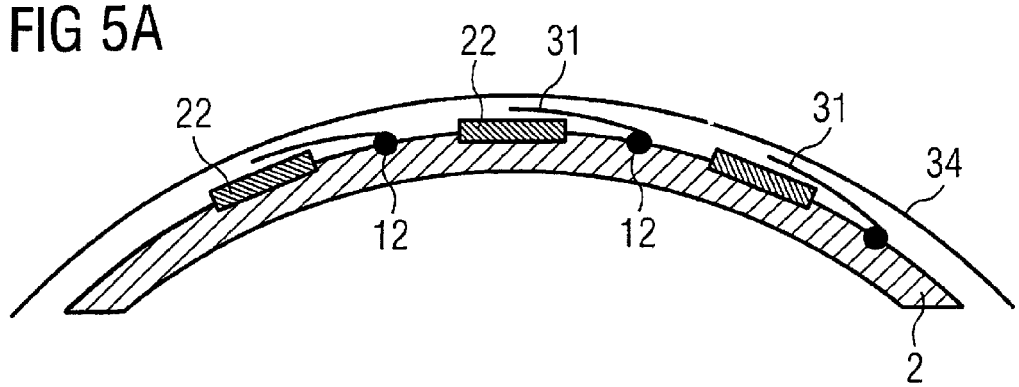
FIG. 5 is a cross-section showing the relative arrangements of the RF antenna elements and microwave antenna elements in a bore tube in accordance with the present invention.
Figure 5B:
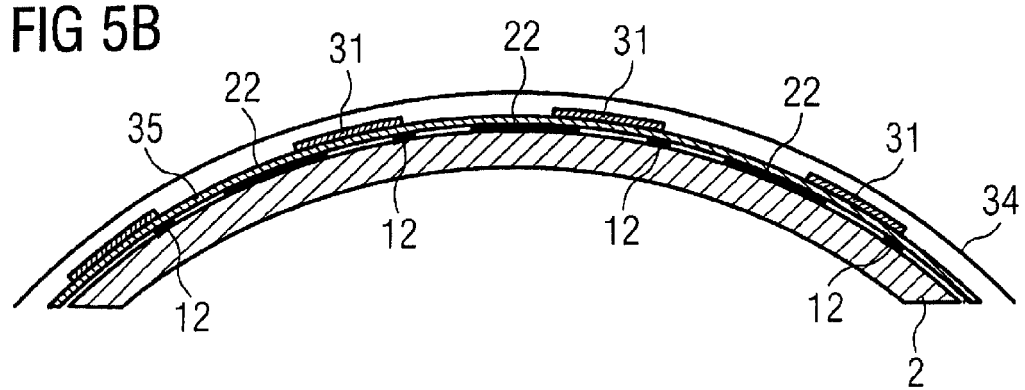

The bore tube of the present invention, shown in FIG. 3 comprises a support tube 2, with bird cage antenna elements 23 provided on the support tube and microwave dipole antenna elements 12 in parallel in gaps between the bird cage antenna elements 23. One method of construction of the microwave array 6 is to print both the body coil 24 and microwave dipole array 6 on a thin flexible substrate material 35, which is wrapped around the outside of the mechanically strong support tube 2 having a similar form to support tubes that are currently in use. As shown in FIG. 5, an RF screen 34 is provided outside the rungs 22 and dipoles 12. This screen then also functions as a reflector for the dipole antenna elements, augmenting their gain towards the bore centre whilst reducing wasteful radiation of energy away from the bore. The bore tube is constructed with the screen layer 34, typically copper, positioned inside the gradient coils and outside the support tube 2, which is typically a plastic tube. The integration of the microwave antenna in the bore tube is arranged to minimize adverse interaction between the two.

Figure 4:
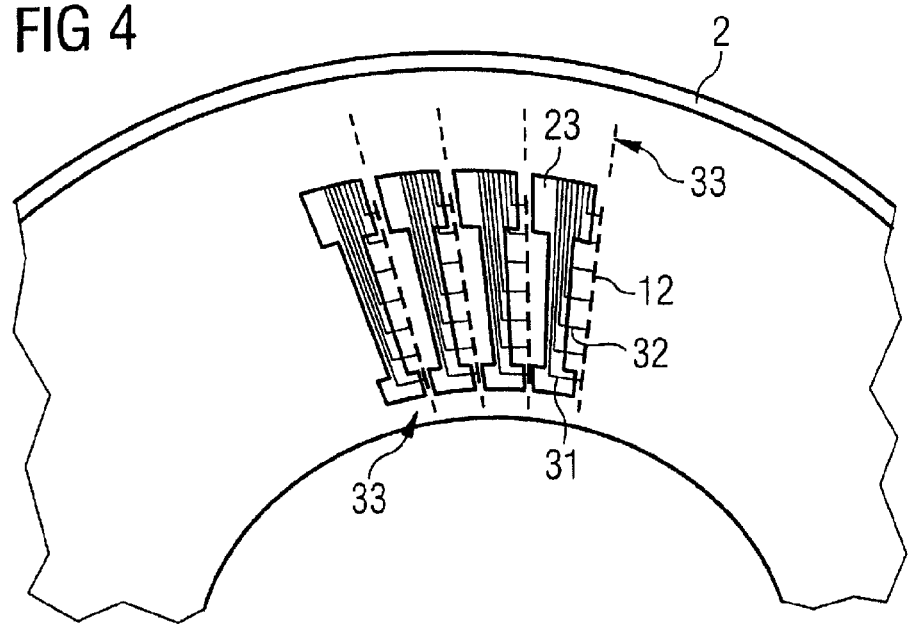
FIG. 4 illustrates the arrangement of FIG. 3, with an example of how feed lines to the microwave antenna elements are provided.

In such a construction, the antennas may be fed by microstrip or stripline feed lines, where the rungs of the body coil form the ground plane for the feeds. The example shown in FIG. 4 is of microstrip feed lines 31, running along the long axis of the RF antenna elements 23, connected to the microwave antennas 12 using Baluns 32. The other end of each feedline is connected to suitable filters, or "traps", (not shown) that are designed to block the transmission of signals at the Larmor frequency, but allow transmission of the microwave signals to and from the bore electronics. Additional microwave antenna elements 33 may be located beyond the ends of the body coil, but also printed on the same substrate material. These elements will radiate with the same polarization as the dipoles to provide the required microwave coverage for both LO illumination and microwave reception of the upconverted signals. These elements may take the form of dipoles or patch antennas.

The microwave feedline 31 and array structure 6 integrated with the body coil 24 has a number of advantages making it suitable for the wireless application. The RF screen 34 acts as a reflector directing energy towards the centre of the bore tube 2. The structure can be fabricated using standard printed circuit board manufacturing methods, so that the structure benefits from thin metallic layers to minimize the introduction of eddy currents caused by the switching of the gradient coils; the structure is mechanically and hence electrically repeatable and so provides a good impedance match at the microwave antenna ports; the structure fits into the existing spatial constraints with no impact on bore diameter; and a single process is used to deposit the body coil 14 and the microwave array 6 on same substrate 35. In an example of using a microstrip feed arrangement, the dipoles 12 and antenna elements 23 may be printed onto one side of a thin pcb, with the feed 31 printed onto the other side with the pcb then wrapped around the outside of the support tube 30. The feed structure of the present invention makes use of the copper rungs in the existing designs as ground planes and therefore has minimal impact on B1 field uniformity and strength. Low noise amplifiers, or similar electronics may also be mounted on the thin PCB within the active bore region, also using the body coil rung 22 as the ground plane. The dc power for these components may be fed via trapped dc feedlines or connected to the zero RF potential points on the body coil, or fed via bias tees and the microwave lines.

Figure 6:
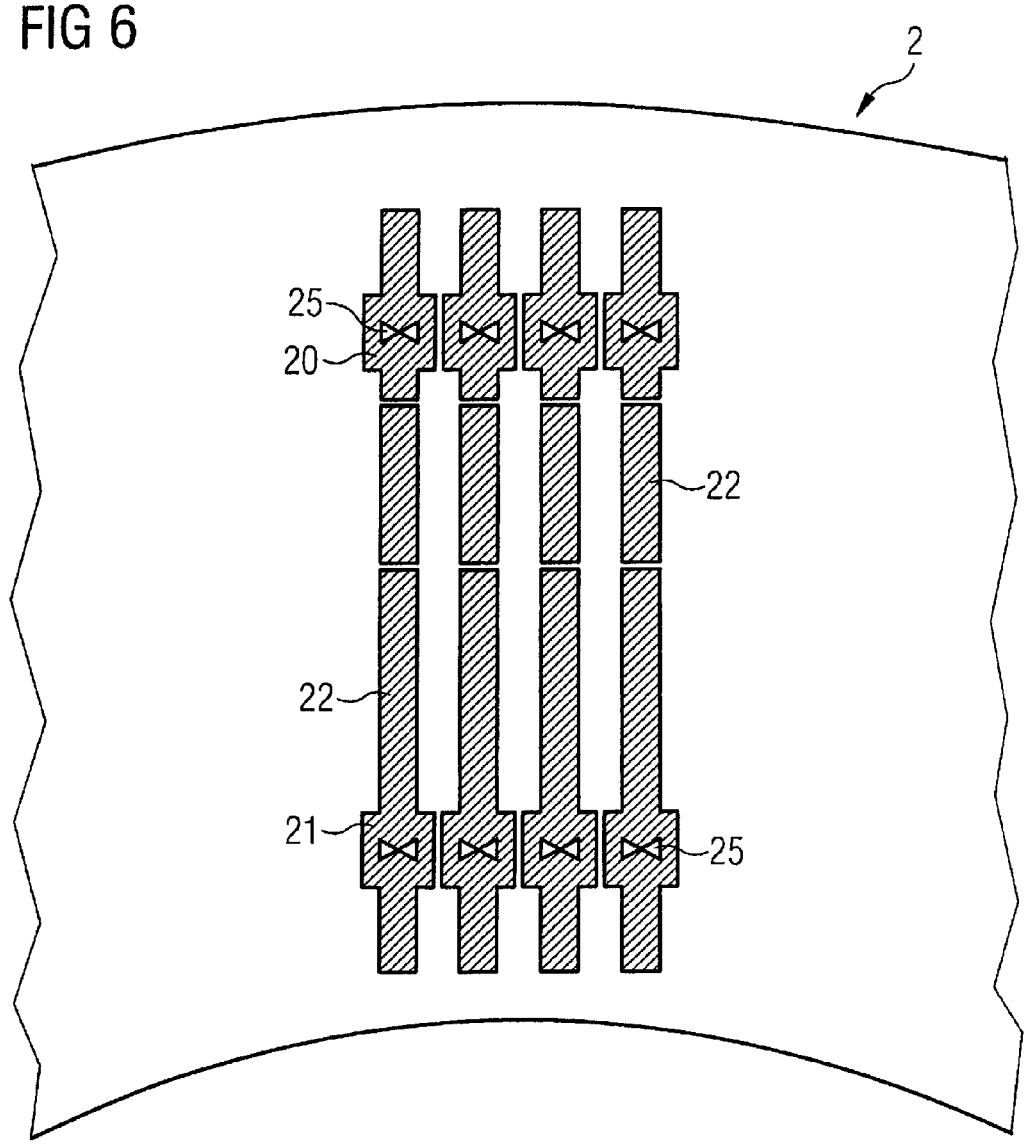
FIG. 6 shows an embodiment of the bore tube assembly of the present invention, in which slot antenna elements are provided in end rings.

The structure of the present invention also lends itself to the introduction of slot antennas 25 in the end rings 20, 21 if space precludes the use of dipoles 12 in this region. This is illustrated in FIG. 6. Such slot antennas are orientated circumferentially to maintain the E-field polarization along the axis of the bore in alignment with the dipoles. Such slot antennas may be aligned parallel with the dominant current flow direction in the end rings 20, 21 and can thereby minimize disruption of the high RF excitation currents. The aggregate antenna structure provides a microwave absorptive surface with the chosen element spacing and feedpoint leading to realizable feedline impedances. Any microwave antennas that do not need to be fed may be terminated with resistive loads to maintain the absorptive properties of the array A benefit of the present invention is that individual patient coils are only activated when they are physically in the field of view. Patient coils outside the field of view do not receive local oscillator power and so do not generate any interference. There is therefore no need for the operator to keep track of the positions of the patient coils. In principle, due to this self-selecting nature of the local coils in the field of view, it would be possible to have a patient mat extending from the neck to the feet of a patient and perform a whole-body scan by moving the patient table in stages, with no need for operator intervention.

Although modifications and changes may be suggested by those skilled in the art, it is the intention of the inventors to embody within the patent warranted hereon all changes and modifications as reasonably and properly come within the scope of their contribution to the art.

We claim as our invention:

1. A bore tube assembly for a wireless magnetic resonance imaging scanner, comprising:
    a bore tube having a central opening therein configured to receive an examination subject therein;
    a radio-frequency antenna mounted in said bore tube;
    a microwave antenna array, operated at a microwave frequency, mounted in said bore tube;
    an electrical screen mounted in said bore tube;
    said RF antenna comprising a plurality of RF antenna elements, each comprising a rung, and said rungs being spaced at intervals between each other of substantially half of a wavelength of the microwave frequency at which said microwave antenna array is operated;
    said microwave antenna array comprising a plurality of microwave antenna elements interleaved between said rungs; and
    said screen serving as a reflector that reflects signals from said microwave antenna elements toward a center of said bore tube.

2. A bore tube assembly as claimed in claim 1 wherein said rungs forming said RF antenna are etched copper structures on a printed circuit board mounted on a support tube in said bore tube.

3. A bore tube assembly as claimed in claim 2 wherein said microwave antenna array elements are formed as etched copper structures on said printed circuit board.

4. A bore tube assembly as claimed in claim 1 wherein said microwave antenna elements are selected from the group consisting of dipole antenna elements, folded dipole antenna elements, inductively loaded dipole antenna elements and capacitively loaded dipole antenna elements.

5. A bore tube assembly as claimed in claim 1 comprising a transmission line structure, selected from the group consisting of a microstrip and a stripline, that feeds said microwave antenna elements.

6. A bore tube assembly as claimed in claim 5 wherein said transmission line structure comprises a plurality of transmission lines respectively feeding said microwave antenna elements, and wherein each transmission line comprises a filter located at an end of the transmission line remote from said microwave antenna elements.

7. A bore tube assembly as claimed in claim 1 wherein said RF antenna array comprises an end ring segment at each end of each rung, forming respective end rings.

8. A bore tube assembly as claimed in claim 7 wherein said end rings comprises slot antennas.

9. A bore tube assembly as claimed in claim 8 wherein said slot antennas are aligned substantially parallel with a primary current flow direction in said end rings.

10. A bore tube assembly as claimed in claim 7 comprising additional microwave antenna elements beyond said end rings of said RF antenna array.

11. A bore tube assembly as claimed in claim 10 wherein said additional microwave antenna elements are selected from the group consisting of dipole antenna elements and patch antenna elements.

12. A bore tube assembly as claimed in claim 10 wherein said additional microwave antenna elements are formed as etched copper structure on a printed circuit board mounted on a support tube attached to said bore tube.

13. A bore tube assembly as claimed in claim 1 wherein said RF antenna is a birdcage antenna.

14. A bore tube assembly as claimed in claim 1 comprising a support tube on which said radio-frequency antenna and said microwave antenna array are mounted, said support tube being mounted to said bore tube and being comprised of electrically insulating material.

15. A bore tube assembly as claimed in claim 14 wherein said electrical screen is located radially outwardly of said support tube.

16. A bore tube assembly as claimed in claim 1 wherein said electrical screen is comprised of copper.

17. A wireless magnetic resonance imaging scanner comprising:
- a magnetic resonance data acquisition device comprising a basic field magnet, gradient coils, a plurality of local coils, and a bore tube assembly; and
- said bore tube assembly comprising a bore tube having a central opening therein configured to receive an examination subject therein, a radio-frequency antenna mounted in said bore tube, a microwave antenna array, operated at a microwave frequency, mounted in said bore tube;
- an electrical screen mounted in said bore tube, said RF antenna comprising a plurality of RF antenna elements, each comprising a rung, and said rungs being spaced at intervals between each other of substantially half of a wavelength of the microwave frequency at which said microwave antenna array is operated, said microwave antenna array comprising a plurality of microwave antenna elements interleaved between said rungs, and said screen serving as a reflector that reflects signals from said microwave antenna elements toward a center of said bore tube.

* * * * *